(12) United States Patent
Hanson et al.

(10) Patent No.: US 9,725,619 B2
(45) Date of Patent: Aug. 8, 2017

(54) COMPOSITION INCLUDING SILICON-CONTAINING COMPOUNDS

(71) Applicant: Aculon, Inc., San Diego, CA (US)

(72) Inventors: Eric L. Hanson, Encinitas, CA (US); Eric L. Bruner, San Diego, CA (US)

(73) Assignee: Aculon, Inc., San Diego, CA (US)

( * ) Notice: Subject to any disclaimer, the term of this patent is extended or adjusted under 35 U.S.C. 154(b) by 0 days.

(21) Appl. No.: 15/014,058

(22) Filed: Feb. 3, 2016

(65) Prior Publication Data

US 2016/0230045 A1 Aug. 11, 2016

Related U.S. Application Data

(60) Provisional application No. 62/112,197, filed on Feb. 5, 2015.

(51) Int. Cl.

| | | |
|---|---|---|
| *C09D 183/12* | (2006.01) | |
| *C08G 77/46* | (2006.01) | |
| *B05D 1/02* | (2006.01) | |
| *B05D 1/18* | (2006.01) | |
| *B05D 1/30* | (2006.01) | |
| *B05D 1/40* | (2006.01) | |
| *B05D 3/02* | (2006.01) | |
| *C08G 77/385* | (2006.01) | |
| *C08L 83/08* | (2006.01) | |
| *C08L 83/12* | (2006.01) | |
| *H05K 1/03* | (2006.01) | |

(52) U.S. Cl.
CPC ............. *C09D 183/12* (2013.01); *B05D 1/02* (2013.01); *B05D 1/18* (2013.01); *B05D 1/305* (2013.01); *B05D 1/40* (2013.01); *B05D 3/0254* (2013.01); *C08G 77/385* (2013.01); *C08G 77/46* (2013.01); *C08L 83/08* (2013.01); *C08L 83/12* (2013.01); *H05K 1/036* (2013.01); *H05K 2203/1173* (2013.01)

(58) Field of Classification Search
None
See application file for complete search history.

(56) References Cited

U.S. PATENT DOCUMENTS

| | | | | |
|---|---|---|---|---|
| 4,900,474 A | * | 2/1990 | Terae | B01D 19/0409 516/118 |
| 5,116,928 A | * | 5/1992 | Inomata | C08G 77/24 528/12 |
| 5,420,189 A | * | 5/1995 | Kishita | C08L 83/08 524/731 |
| 5,464,917 A | * | 11/1995 | Kishita | C08G 77/24 528/14 |
| 5,585,451 A | | 12/1996 | Burkus, II et al. | |
| 7,432,235 B2 | * | 10/2008 | Takewaki | C08G 77/46 510/317 |
| 7,794,843 B2 | * | 9/2010 | Yamane | C07F 7/21 428/447 |
| 7,879,437 B2 | * | 2/2011 | Hanson | C08L 83/04 428/207 |
| 8,129,435 B2 | * | 3/2012 | Yamaguchi | B01D 19/0409 516/144 |
| 2011/0288245 A1 | * | 11/2011 | Roscher | C08L 83/04 525/475 |
| 2015/0299561 A1 | * | 10/2015 | Monroe | C09K 8/86 166/305.1 |

OTHER PUBLICATIONS

Meals, "Hydrosilation in the Synthesis of Organosilanes," Pure Appl. Chem., 1966, pp. 141-157, vol. 13, No. 1-2.
Peterson, "Recent Advances in the Hydrosilylation of Alkynes," 2003, pp. 1-4, Department of Chemistry, University of California, Irvine.

* cited by examiner

*Primary Examiner* — Robert S Loewe
(74) *Attorney, Agent, or Firm* — The Webb Law Firm

(57) ABSTRACT

Compositions including first and second silicon-containing compounds are described. The first silicon-containing compound includes a polyvalent transition metal having bonded thereto a hydrocarbyloxy group(s) and/or a (di-hydrocarbyl)(perfluoro/fluorinated-hydrocarbyl)silyloxy group(s), which is represented by Formula (I). The second silicon-containing compound includes a reaction product of a first reactant represented by Formula (II-A), which includes hyrdrocarbylsilyloxy groups, and a second reactant represented by Formula (II-B), which includes a perfluorohydrocarbyloxy group(s). The present invention also relates to, articles that include one or more layers formed from such compositions, methods of treating articles by applying thereover such compositions, and the second silicon-containing compound.

19 Claims, No Drawings

COMPOSITION INCLUDING SILICON-CONTAINING COMPOUNDS

CROSS REFERENCE TO RELATED APPLICATION

The present application is entitled to and claims the benefit of priority of U.S. Provisional Patent Application No. 62/112,197, filed on Feb. 5, 2015.

FIELD

The present invention relates to a composition that includes a first silicon-containing compound that includes a polyvalent transition metal, and a second silicon-containing compound that includes the reaction product of first and second reactants, in which the second reactant includes a perfluorohydrocarbyloxy group(s); articles that include a layer including such a composition; a method of treating an article with such a composition; and the second silicon-containing compound.

BACKGROUND

Silicon-containing compounds and compositions containing such compounds can be used to treat the surface of articles for purposes including modifying the surface properties, such as reducing the surface(s) tension and increasing the hydrophobicity, of such articles. Reducing the surface tension and increasing the hydrophobicity of an article can be desirable for reasons including, for example, improved processing thereof, such as cleaning and/or repelling moisture from certain treated areas of the article. The retention of many silicon-containing compounds on the surfaces of treated articles typically is poor. Such poor retention times can result in defective products, or the need to subsequently treat previously treated articles with fresh silicon-containing compounds, which can in each case result in increased production costs.

It would be desirable to develop new silicon-containing compounds, and compositions containing such newly developed compounds, which have improved properties, such as improved surface retention and durability.

SUMMARY

In accordance with the present invention, there is provided a composition comprising, (a) at least one first silicon-containing compound represented by the following Formula (I),

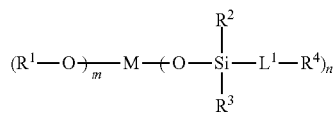
(I)

With reference to Formula (I): M is a polyvalent transition metal; $R^1$, $R^2$, and $R^3$ are each independently hydrocarbyl; $L^1$ is a bond or a divalent hydrocarbyl group; $R^4$ is a perfluorohydrocarbyl group; and the sum of m and n is equal to the valency of said polyvalent transition metal M. The composition further comprises, (b) at least one second silicon-containing compound comprising a reaction product of a first reactant represented by the following Formula (II-A) and a second reactant represented by the following Formula (II-B),

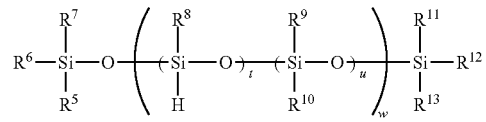
(II-A)

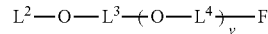
(II-B)

With reference to Formula (II-A) and Formula (II-B): $R^5$ through $R^{13}$ are each independently hydrocarbyl; $L^2$ is a hydrocarbyl group having at least one carbon-carbon unsaturated group that is capable of forming a silicon-carbon covalent bond; $L^3$ is a divalent fluorinated hydrocarbyl group; $L^4$ is a divalent perfluorohydrocarbyl group; w is from 1 to 500; t is from 0 to 1000; u is from 0 to 1000, provided that the sum of t and u is at least 1 for each w, and provided that t is at least 1 for at least one w; and v is from 1 to 100.

In accordance with the present invention, there is further provided an article comprising a layer over at least a portion of a surface of the article, wherein the layer comprises the composition as described above.

In further accordance with the present invention, there is provided a method of treating an article comprising, applying the composition as described above over at least a portion of a surface of the article, thereby forming a layer comprising the composition as described above over at least a portion of the surface of the article.

In accordance with the present invention, there is additionally provided a silicon-containing compound comprising a reaction product of a first reactant represented by Formula (II-A) and a second reactant represented by Formula (II-B) as described above.

The features that characterize the present invention are pointed out with particularity in the claims, which are annexed to and form a part of this disclosure. These and other features of the invention, its operating advantages and the specific objects obtained by its use will be more fully understood from the following detailed description in which non-limiting embodiments of the invention are illustrated and described.

DETAILED DESCRIPTION

As used herein, the articles "a," "an," and "the" include plural referents unless otherwise expressly and unequivocally limited to one referent.

Unless otherwise indicated, all ranges or ratios disclosed herein are to be understood to encompass any and all subranges or subratios subsumed therein. For example, a stated range or ratio of "1 to 10" should be considered to include any and all subranges between (and inclusive of) the minimum value of 1 and the maximum value of 10; that is, all subranges or subratios beginning with a minimum value of 1 or more and ending with a maximum value of 10 or less, such as but not limited to, 1 to 6.1, 3.5 to 7.8, and 5.5 to 10.

As used herein, unless otherwise indicated, left-to-right representations of linking groups, such as divalent linking groups, are inclusive of other appropriate orientations, such as, but not limited to, right-to-left orientations. For purposes of non-limiting illustration, the left-to-right representation of the divalent linking group

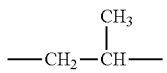

or equivalently —CH$_2$CH(CH$_3$)—, is inclusive of the right-to-left representation thereof,

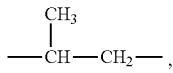

or equivalently —CH(CH$_3$)CH$_2$— or —(CH$_3$)CHCH$_2$—. For purposes of further non-limiting illustration, the left-to-right representation of the divalent linking group

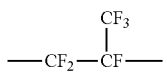

or equivalently —CF$_2$CF(CF$_3$)—, is inclusive of the right-to-left representation thereof,

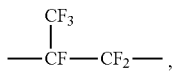

or equivalently —CF(CF$_3$)CF$_2$— or —(CF$_3$)CFCF$_2$—.

Other than in the operating examples, or where otherwise indicated, all numbers expressing quantities of ingredients, reaction conditions, and so forth used in the specification and claims are to be understood as modified in all instances by the term "about."

As used herein, molecular weight values of polymers, such as weight average molecular weights (Mw) and number average molecular weights (Mn), are determined by gel permeation chromatography using appropriate standards, such as polystyrene standards.

As used herein, polydispersity index (PDI) values represent a ratio of the weight average molecular weight (Mw) to the number average molecular weight (Mn) of the polymer (i.e., Mw/Mn).

As used herein, the term "polymer" means homopolymers (e.g., prepared from a single monomer species), copolymers (e.g., prepared from at least two monomer species), and graft polymers.

As used herein, spatial or directional terms, such as "left", "right", "inner", "outer", "above", "below", and the like, relate to the invention as it is depicted in the drawing figures. It is to be understood, however, that the invention can assume various alternative orientations and, accordingly, such terms are not to be considered as limiting.

All documents, such as but not limited to issued patents and patent applications, referred to herein, and unless otherwise indicated, are to be considered to be "incorporated by reference" in their entirety.

As used herein, recitations of "linear or branched" groups, such as linear or branched alkyl, are herein understood to include: a methylene group or a methyl group; groups that are linear, such as linear C$_2$-C$_{20}$ alkyl groups; and groups that are appropriately branched, such as branched C$_3$-C$_{20}$ alkyl groups.

The silicon-containing compounds and reactants from which such silicon-containing compounds are prepared in accordance with various embodiments of the present invention include groups and sub-groups that can in each case be independently selected from hydrocarbyl. As used herein the term "hydrocarbyl" and similar terms, such as "hydrocarbyl substituent," means: linear or branched C$_1$-C$_{25}$ alkyl (e.g., linear or branched C$_1$-C$_{10}$ alkyl); linear or branched C$_2$-C$_{25}$ alkenyl (e.g., linear or branched C$_2$-C$_{10}$ alkenyl); linear or branched C$_2$-C$_{25}$ alkynyl (e.g., linear or branched C$_2$-C$_{10}$ alkynyl); C$_3$-C$_{12}$ cycloalkyl (e.g., C$_3$-C$_{10}$ cycloalkyl); C$_5$-C$_{18}$ aryl (including polycyclic aryl groups) (e.g., C$_5$-C$_{10}$ aryl); and C$_6$-C$_{24}$ aralkyl (e.g., C$_6$-C$_{10}$ aralkyl).

Representative alkyl groups include but are not limited to methyl, ethyl, propyl, isopropyl, butyl, isobutyl, sec-butyl, tert-butyl, pentyl, neopentyl, hexyl, heptyl, octyl, nonyl and decyl. Representative alkenyl groups include but are not limited to vinyl, allyl and propenyl. Representative alkynyl groups include but are not limited to ethynyl, 1-propynyl, 2-propynyl, 1-butynyl, and 2-butynyl. Representative cycloalkyl groups include but are not limited to cyclopropyl, cyclobutyl, cyclopentyl, cyclohexyl, and cyclooctyl substituents. Representative aryl groups include but are not limited to phenyl, naphthyl, anthracynyl and triptycenyl. Representative aralkyl groups include but are not limited to benzyl, and phenethyl.

The term "alkyl" as used herein, in accordance with some embodiments, means linear or branched alkyl, such as but not limited to, linear or branched C$_1$-C$_{25}$ alkyl, or linear or branched C$_1$-C$_{10}$ alkyl, or linear or branched C$_2$-C$_{10}$ alkyl. Examples of alkyl groups from which the various alkyl groups of the present invention can be selected from, include, but are not limited to, those recited previously herein. Alkyl groups of the various compounds of the present invention can, with some embodiments, include one or more unsaturated linkages selected from —CH=CH— groups and/or one or more —C≡C— groups. With some embodiments, the alkyl groups are free of two or more conjugated unsaturated linkages. With some embodiments, the alkyl groups are free of unsaturated linkages, such as —CH=CH— groups and —C≡C— groups.

The term "cycloalkl" as used herein, in accordance with some embodiments, means groups that are appropriately cyclic, such as but not limited to, C$_3$-C$_{12}$ cycloalkyl (including, but not limited to, cyclic C$_5$-C$_7$ alkyl) groups. Examples of cycloalkyl groups include, but are not limited to, those recited previously herein. The term "cycloalkyl" as used herein in accordance with some embodiments also includes: bridged ring polycycloalkyl groups (or bridged ring polycyclic alkyl groups), such as but not limited to, bicyclo[2.21]heptyl (or norbornyl) and bicyclo[2.2.2]octyl; and fused ring polycycloalkyl groups (or fused ring polycyclic alkyl groups), such as, but not limited to, octahydro-1H-indenyl, and decahydronaphthalenyl.

The term "aralkyl," as used herein, and in accordance with some embodiments, includes but is not limited to C$_6$-C$_{24}$ aralkyl, such as but not limited to C$_6$-C$_{10}$ aralkyl, and means an aryl group substituted with an alkyl group. Examples of aralkyl groups include, but are not limited to, those recited previously herein.

The silicon-containing compounds and reactants from which such silicon-containing compounds are prepared in accordance with various embodiments of the present invention include groups and sub-groups that can in each case be independently selected from perfluorohydrocarbyl. As used herein the term "perfluorohydrocarbyl" and similar terms, such as "perfluorohydrocarbyl substituent," means a hydrocarbyl group in which all available hydrogens thereof are replaced with fluoro groups (—F). As used herein, the term "perfluorohydrocarbyl" and similar terms, such as "perfluorohydrocarbyl substituent," further means and includes: linear or branched $C_1$-$C_{25}$ perfluoroalkyl (e.g., linear or branched $C_1$-$C_{10}$ perfluoroalkyl); linear or branched $C_2$-$C_{25}$ perfluoroalkenyl (e.g., linear or branched $C_2$-$C_{10}$ perfluoroalkenyl); linear or branched $C_2$-$C_{25}$ perfluoroalkynyl (e.g., linear or branched $C_2$-$C_{10}$ perfluoroalkynyl); $C_3$-$C_{12}$ perfluorocycloalkyl (e.g., $C_3$-$C_{10}$ perfluorocycloalkyl); $C_5$-$C_{18}$ perfluoroaryl (including polycyclic perfluoroaryl groups) (e.g., $C_5$-$C_{10}$ perfluoroaryl); and $C_6$-$C_{24}$ perfluoroaralkyl (e.g., $C_6$-$C_{10}$ perfluoroaralkyl).

Representative perfluoroalkyl groups include but are not limited to perfluoronated forms of those alkyl groups recited previously herein. Representative perfluoalkenyl groups include but are not limited to perfluoronated forms of those alkenyl groups recited previously herein. Representative perfluoroalkynyl groups include but are not limited to perfluoronated forms of those alkynyl groups recited previously herein. Representative perfluorocycloalkyl groups include but are not limited to perfluoronated forms of those cycloalkyl groups recited previously herein. Representative perfluoroaryl groups include but are not limited to perfluoronated forms of those aryl groups recited previously herein. Representative perfluoroaralkyl groups include but are not limited to perfluoronated forms of those aralkyl groups recited previously herein.

The term "perfluoroalkyl" as used herein, in accordance with some embodiments, means linear or branched perfluoroalkyl, such as but not limited to, linear or branched $C_1$-$C_{25}$ perfluoroalkyl, or linear or branched $C_1$-$C_{10}$ perfluoroalkyl, or linear or branched $C_2$-$C_{10}$ perfluoroalkyl. Examples of perfluoroalkyl groups from which the various perfluoroalkyl groups of the present invention can be selected from, include, but are not limited to, those recited previously herein. Perfluoroalkyl groups of the various compounds of the present invention can, with some embodiments, include one or more unsaturated linkages selected from —CF=CF— groups and/or one or more —C≡C— groups. With some embodiments, the perfluoroalkyl groups are free of two or more conjugated unsaturated linkages. With some further embodiments, the perfluoroalkyl groups are free of unsaturated linkages, such as —CF=CF— groups and —C≡C— groups.

The term "perfluorocycloalkl" as used herein, in accordance with some embodiments, means perfluoro groups that are appropriately cyclic, such as but not limited to, $C_3$-$C_{12}$ perfluorocycloalkyl (including, but not limited to, cyclic $C_5$-$C_7$ perfluoroalkyl) groups. Examples of perfluorocycloalkyl groups include, but are not limited to, those recited previously herein. The term "perfluorocycloalkyl" as used herein in accordance with some embodiments also includes: bridged ring perfluoropolycycloalkyl groups (or bridged ring polycyclic perfluoroalkyl groups), such as but not limited to, perfluoronated forms of those bridged ring polycycloalkyl groups recited previously herein; and fused ring perfluoropolycycloalkyl groups (or fused ring polycyclic perfluoroalkyl groups), such as, but not limited to, perfluoronated forms of those of those fused ring polycycloalkyl groups recited previously herein.

The polyvalent transition metal M independently for each first silicon-containing compound represented by Formula (I), in accordance with some embodiments of the present invention, is selected from one or more metals of, groups 3 to 12, the lanthanide series, and/or the actinide series of the periodic table of the elements. The transition metal M has a valency of at least 2, with some embodiments.

In accordance with some further embodiments, the polyvalent transition metal M independently for each first silicon-containing compound represented by Formula (I) is selected from Nb, Hf, Ta, W, and La. In accordance with some further embodiments, the polyvalent transition metal M independently for each first silicon-containing compound represented by Formula (I) is Nb or Ta.

With some embodiments, the sum of m and n of Formula (I) is equal to the valency of the polyvalent transition metal M. In accordance with some further embodiments, the sum of m and n of Formula (I) is equal to the valency of the polyvalent transition metal M, and n is at least 1. The sum of m and n is at least 2, with some embodiments. With some additional embodiments, the sum of m and n is at least 2, and n is at least 1. In accordance with some embodiments, and independently for each first silicon-containing compound represented by Formula (I): M is Ta or Nb; the sum of m and n is 5; subscript m is at least 0, such as from 0 to 4 (such as 0, 1, 2, 3, or 4); and subscript n is at least 1, such as from 1 to 5 (such as 1, 2, 3, 4, or 5).

Independently for each first silicon-containing compound represented by Formula (I), and in accordance with some embodiments: $R^1$, $R^2$, and $R^3$ are each independently linear or branched $C_1$-$C_{10}$ alkyl, $C_3$-$C_{10}$ cycloalkyl, or aryl; $L^1$ is a bond (such as a single bond) or divalent linear or branched $C_1$-$C_{10}$ alkyl group; and $R^4$ is linear or branched $C_1$-$C_{20}$ perfluoroalkyl.

Independently for each first silicon-containing compound represented by Formula (I), and in accordance with some further embodiments: M is Ta; $R^1$, $R^2$, and $R^3$ are each independently selected from linear or branched $C_1$-$C_5$ alkyl; $L^1$ is a bond (such as a single bond) or divalent linear or branched $C_1$-$C_5$ alkyl; and $R^4$ is linear or branched $C_1$-$C_{10}$ perfluoroalkyl. In accordance with some embodiments, independently for each first silicon-containing compound represented by Formula (I), M is Ta, and the sum of m and n is 5. With some additional embodiments, for each first silicon-containing compound represented by Formula (I), M is Ta, the sum of m and n is 5, and n is at least 1. For each first silicon-containing compound represented by Formula (I), and with some further embodiments, M is Ta, the sum of m and n is 5, m is 3, and n is 2.

Examples of linear or branched alkyl groups from which each of $R^1$, $R^2$, and $R^3$ of Formula (I) are each independently selected, include but are not limited to those examples recited previously herein with regard to alkyl groups. With some embodiments, $R^1$, $R^2$, and $R^3$ are each independently selected from methyl, ethyl, propyl, isopropyl, butyl, isobutyl, see-butyl, tert-butyl, pentyl, and branched pentyl.

Examples of divalent linear or branched alkyl groups from which $L^1$ of each first silicon-containing compound represented by Formula (I) can be independently selected include, but are not limited to, divalent versions of those examples of alkyl groups recited previously herein. With some embodiments, $L^1$ of each first silicon-containing compound represented by Formula (I) is independently a bond (such as a single bond), divalent methyl, divalent ethyl, divalent propyl, divalent isopropyl, divalent n-butyl, divalent branched-butyl, divalent n-pentyl, and divalent branched-pentyl.

Examples of linear or branched perfluoroalkyl groups from which $R^4$ of each first silicon-containing compound represented by Formula (I) can be independently selected include, but are not limited to, divalent versions of those examples of perfluoroalkyl groups recited previously herein. With some embodiments, $R^4$ of each first silicon-containing compound represented by Formula (I) is independently selected from perfluoromethyl, perfluoroethyl, perfluoropropyl, perfluoroisopropyl, perfluorobutyl, perfluoroisobutyl, perfluorosec-butyl, perfluorotert-butyl, perfluoropentyl, perfluoro-branched-pentyl; perfluoro n-hexyl, perfluoro branched-hexyl, perfluoro n-heptyl, perfluoro branched-heptyl, perfluoro n-octyl, perfluoro branched-octyl, perfluoro n-nonyl, perfluoro branched-nonyl, perfluoro n-decyl, and perfluoro branched-decyl.

In accordance with some embodiments, the first silicon-containing compound includes a compound represented by the following Formula (I-A),

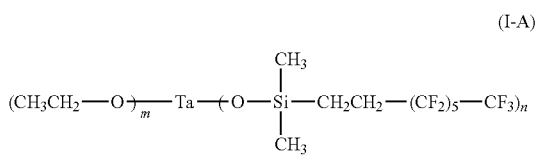

With reference to Formula (I-A), and with some embodiments, the sum of m and n is 5. With reference to Formula (I-A), and with some further embodiments, the sum of m and n is 5, and n is at least 1. In accordance with some additional embodiments, and with further reference to Formula (I-A), the sum of m and n is 5, m is 3, and n is 2.

The first silicon-containing compound of the compositions of the present invention, such as represented by Formula (I) and/or Formula (I-A), can be prepared in accordance with art-recognized methods. For purposes of non-limiting and general illustration, the first silicon-containing compound can, with some embodiments, be prepared from the reaction of: a transition metal halide, such as tantalum pentachloride; a hydrocarbanol, such as ethanol; and a dialkyl-fluoroalkyl-silanol, such as dimethyl(3,3,4,4,5,5,6,6,7,7,8,8,8-tridecafluorooctyl)silanol. The relative amounts, such as moles, of the reactants can be selected so as to obtain a reaction product, such as represented by Formula (I) or (I-A), in which subscripts m and n fall within the ranges as describe previously herein. The reaction is typically conducted under conditions of low humidity for purposes of, such as, minimizing hydrolysis of the reactants. The reaction can be conducted neat or in the presence of a non-reactive solvent, such as a chlorinated and/or fluorinated solvent. The reaction can occur at room temperature (such as 25° C.) and/or under conditions of elevated temperature, for a suitable period of time, such as from 1 to 60 minutes. Solvent, if present, can be removed after completion of the reaction by distillation, optionally under conditions of reduced pressure. The reaction, with some embodiments, results in the formation of co-product hydrogen halide, such as HCl, which can be removed or separated from the first silicon-containing compound in accordance with art-recognized work-up procedures.

In accordance with some further embodiments, the first silicon-containing compound of the compositions of the present invention can be prepared from the reaction of: a polyalkoxy transition metal, such as pentaethoxytantalum; and a dialkyl-fluoroalkyl-silanol, such as dimethyl(3,3,4,4,5,5,6,6,7,7,8,8,8-tridecafluorooctyl)silanol, with concurrent removal of alcohol, such as ethanol, from the reaction mixture as the reaction progresses. The relative amounts, such as relative moles, of polyalkoxy transition metal and dialkyl-fluoroalkyl-silanol can be selected so as to obtain a reaction product, such as represented by Formula (I) or (I-A), in which subscripts m and n fall within the ranges as describe previously herein. The reaction is typically conducted under conditions of low humidity for purposes of, such as, minimizing hydrolysis of the reactants. The reaction can be conducted neat or in the presence of a non-reactive solvent, such as a chlorinated and/or fluorinated solvent. The reaction can occur at room temperature (such as 25° C.) and/or under conditions of elevated temperature, for a suitable period of time, such as from 1 to 60 minutes. Solvent, if present, can be removed after completion of the reaction by distillation, optionally under conditions of reduced pressure.

The compositions of the present invention, further include at least one second silicon-containing compound that includes a reaction product of a first reactant represented by Formula (II-A) and a second reactant represented by Formula (II-B), as described previously herein. In accordance with some embodiments, for the first reactant represented by Formula (II-A) and the second reactant represented by Formula (II-B), from which the second silicon-containing compound is prepared: $R^5$ through $R^{13}$ are each independently selected from the group consisting of linear or branched $C_1$-$C_{10}$ alkyl, $C_3$-$C_{10}$ cycloalkyl, and aryl; $L^2$ is divalent linear or branched $C_2$-$C_{10}$ alkyl having one carbon-carbon unsaturated group that is capable of forming a silicon-carbon covalent bond, which is selected from alkene groups and alkyne groups; $L^3$ is divalent linear or branched $C_1$-$C_{10}$ fluoroalkyl; $L^4$ is divalent linear or branched $C_1$-$C_{10}$ perfluoroalkyl; w is from 1 to 100; t is from 0 to 500; u is from 0 to 500; and v is from 1 to 50.

In accordance with some further embodiments, for the first reactant represented by Formula (II-A) and the second reactant represented by Formula (II-B), from which the second silicon-containing compound is prepared: $R^5$ through $R^{13}$ are each independently selected from the group consisting of linear or branched $C_1$-$C_5$ alkyl; $L^2$ is divalent linear or branched $C_2$-$C_5$ alkyl having one carbon-carbon unsaturated group that is capable of forming a silicon-carbon covalent bond, which is selected from alkene groups; $L^3$ is divalent linear or branched $C_1$-$C_5$ fluoroalkyl; $L^4$ is divalent linear or branched $C_1$-$C_5$ perfluoroalkyl; w is from 1 to 50; t is from 0 to 100; u is from 0 to 100; and v is from 1 to 20.

With some embodiments, the first reactant represented by Formula (II-A), from which the second silicon-containing compound is prepared, can have any suitable ratio of subscripts t to u. In accordance with some embodiments, the first reactant represented by Formula (II-A) has an average ratio of t to u of from: 0.5:1 to 2:1; or from 0.75:1 to 1.75:1; or from 0.8 to 1 to 1.8:1.

In accordance with some embodiments, for the first reactant represented by Formula (II-A), from which the second silicon-containing compound is prepared: subscript t is from 1 to 1000, or from 1 to 500, or from 1 to 100, or from 1 to 50, or from 1 to 25, or from 1 to 20; and subscript u is 0.

The second silicon-containing compound, with some embodiments, comprises a reaction product of a first reactant represented by the following Formula (II-A-1) and a second reactant represented by the following Formula (II-B-1):

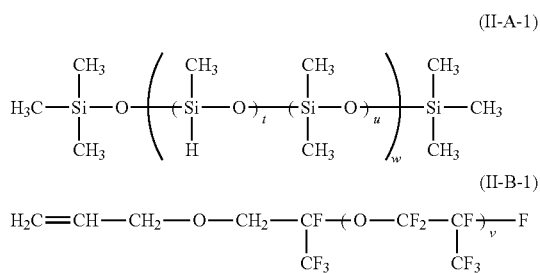

(II-A-1)

(II-B-1)

With reference to Formula (II-A-1) and Formula (II-B-1): w is from 1 to 20; t is from 0 to 50; u is from 0 to 50; provided that the sum of t and u is at least 1 for each w, and provided that t is at least 1 for at least one w; and v is from 1 to 20.

The first reactant, such as represented by Formula (II-A) or Formula (II-A-1), and the second reactant, such as represented by Formula (II-B) or Formula (II-B-1), from which the second silicon-containing compound is prepared, can each be prepared in accordance with art-recognized methods.

The second silicon-containing compound, with some embodiments of the present invention, comprises a reaction product of a first reactant represented by Formula (II-A) and a second reactant represented by Formula (II-B), and the reaction product can be represented by the following Formula (II-C):

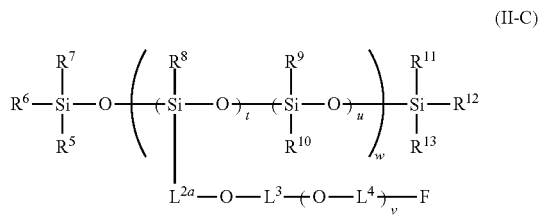

(II-C)

With reference to Formula (II-C), $R^5$-$R^{13}$, t, u, w, $L^3$, and $L^4$, are each independently as described previously herein. With further reference to Formula (II-C), $L^{2a}$ is a divalent residue, such as a divalent hydrocarbyl residue, of $L^2$ of Formula (II-B), in which a carbon-carbon unsaturated group thereof has formed a silicon-carbon covalent bond with the first reactant represented by Formula (II-A).

The second silicon-containing compound, with some embodiments of the present invention, comprises a reaction product of a first reactant represented by Formula (II-A-1) and a second reactant represented by Formula (II-B-1), and the reaction product can be represented by the following Formula (II-D):

(II-D)

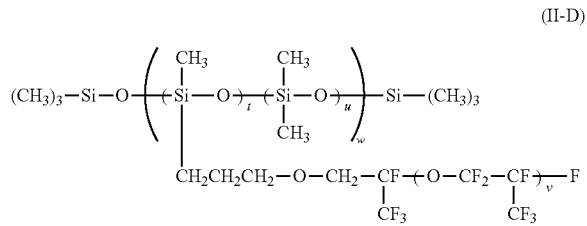

With reference to Formula (II-D), subscripts t, u, w, and v are each independently as described previously herein. With further reference to Formula (II-D), and in accordance with some embodiments: w is from 1 to 20; t is from 0 to 50 or from 1 to 50; u is from 0 to 50; the sum of t and u is at least 1 for each w; and v is from 1 to 20. With further reference to Formula (II-A), and in accordance with some embodiments, t is from 1 to 50, and u is 0.

For purposes of non-limiting illustration, and in accordance with some embodiments, the reaction of the first reactant, such as represented by Formula (II-A) or Formula (II-A-1), and the second reactant, such as represented by Formula (II-B) or Formula (II-B-1), can be conducted, with some embodiments: at room temperature (such as at 25° C.) or elevated temperature; optionally in the presence of a suitable catalyst, such as $H_2PtCl_6$; and optionally in the presence of a solvent, such as one or more perfluoroalkyl-alkyl-ethers. The relative amounts, such a moles, of the first reactant, such as represented by Formula (II-A) or Formula (II-A-1), and the second reactant, such as represented by Formula (II-B) or Formula (II-B-1), can be selected, with some embodiments, so as to result in the formation of a second silane-containing compound represented by Formula (II-C) or Formula (II-D).

The second silicon-containing compound, such as represented by Formula (II-C) and/or Formula (II-D) has, with some embodiments, a weight average molecular weight (Mw) of at least 400, such as from 400 to 30,000 or from 500 to 20,000, such as from 600 to 15,000.

In accordance with some embodiments of the composition of the present invention: (a) the first silicon-containing compound includes a compound represented by the Formula (I-A), as described previously herein; and (b) the second silicon-containing compound includes a reaction product of a first reactant represented by Formula (II-A-1) and a second reactant represented by Formula (II-B-1), as described previously herein.

With some embodiments of the composition of the present invention, the weight ratio of the first silicon compound (a) to the second silicon compound (b) is: from 0.2:1 to 5:1; or from 0.25:1 to 4:1; or from 0.3:1 to 3:1.

With some further embodiments of the composition of the present invention, the first silicon-containing compound (a) and the second silicon-containing compound (b) are together present in an amount of: from 0.05 percent by weight to 20 percent by weight; from 0.1 percent by weight to 15 percent by weight; or from 0.15 percent by weight to 10 percent by weight; or from 0.2 percent by weight to 5 percent by weight, in each case, the percent weights being based on total weight of the composition.

The compositions of the present invention, with some embodiments, can further include at least one of: (i) an alcohol; (ii) a perfluorohydrocarbyl-hydrocarbyl ether; and/or (iii) a liquid hydrocarbon.

With some embodiments, the optional alcohol (i) of the composition is, with some embodiments, represented by the following Formula (III),

(III)

With reference to Formula (III), and with some embodiments, $R^5$ is a hydrocarbyl group, and x is from 1 to 10.

The hydrocarbyl groups from which $R^{15}$ of Formula (III) can be selected include, but are not limited to, those classes and examples of hydrocarbyl groups described previously herein. With some embodiments, $R^{15}$ of Formula (III) is linear or branched $C_1$-$C_{10}$ alkyl, $C_3$-$C_{10}$ cycloalkyl, or aryl. The subscript x of Formula (III) is from 1 to 10, or from 1 to 8, or from 1 to 7, or from 1 to 6, or from 1 to 5, or from 1 to 4, or from 1 to 3, or from 1 to 2 (or 1 or 2). With some embodiments, subscript x of Formula (III) is from 1 to 3. Examples of alcohols (i) that can be optionally included in the composition of the present invention include, but are not limited to, methanol, ethanol, n-propanol, iso-propanol, linear or branched butanol, linear or branched pentanol, linear or branched hexanol, linear or branched septanol, linear or branched octanol, linear or branched nonanol, linear or branched decanol, trimethylol propane, pentaeriythritol, bis(trimethylol propane), alkylene glycols (such as, but not limited to, ethylene glycol, propylene glycol, and butylene glycol), cyclopropanol, cyclobutanol, cyclopentanol, cyclohexanol, cycloheptanol, cyclooctanol, cyclononanol, cyclodeconol, phenol, benzyl alcohol, xylenol, and combinations of two or more thereof.

The optional perfluorohydrocarby-hydrocarbyl ether (ii) of the composition is, with some embodiments, represented by the following Formula (IV)

$$R^{16}\text{—O—}R^{17} \qquad (IV)$$

With reference to Formula (IV), and with some embodiments, $R^{16}$ is a perfluorohydrocarbyl group, and $R^{17}$ is a hydrocarbyl group.

The perfluorohydrocarbyl groups from which $R^{16}$ of Formula (IV) can be selected include, but are not limited to, those classes and examples of perfluorohydrocarbyl groups described previously herein. With some embodiments, $R^{16}$ of Formula (IV) is linear or branched $C_1$-$C_{10}$ perfluoroalkyl. The hydrocarbyl groups from which $R^{17}$ of Formula (IV) can be selected include, but are not limited to, those classes and examples of hydrocarbyl groups described previously herein. With some embodiments, $R^{17}$ of Formula (IV) is linear or branched $C_1$-$C_{10}$ alkyl, $C_3$-$C_{10}$ cycloalkyl, or aryl.

The optional liquid hydrocarbon (iii) of the composition is, with some embodiments, selected from hydrocarbon forms of those classes and examples of hydrocarbyl groups described previously herein, such as, but not limited to, alkanes, alkenes, alkynes, cycloalkanes, aromatic compounds, alkyl substituted aromatic compounds, and combinations of two or more thereof. With some embodiments, the optional liquid hydrocarbon (iii) of the compositions of the present invention includes at least one linear or branched $C_5$-$C_{20}$ alkane, or at least one linear or branched $C_5$-$C_{10}$ alkane, or at least one linear or branched $C_5$-$C_8$ alkane.

In accordance with some embodiments of the present invention: the optional alcohol (i) includes isopropanol; the optional perfluorohydrocarbyl-hydrocarbyl ether (ii) includes perfluoro-n-butyl methyl ether and/or perfluoro-n-butyl ethyl ether; and the optional liquid hydrocarbon (iii) includes linear or branched $C_7$ alkane and/or linear or branched $C_8$ alkane.

The alcohol (i), the perfluorohydrocarbyl-hydrocarbyl ether (ii), and/or the liquid hydrocarbon (iii), are together present in the composition of the present invention, with some embodiments, in an amount of at least 97 percent by weight, or at least 97.5 percent by weight, based on total weight of the composition. With some embodiments, the alcohol (i), the perfluorohydrocarbyl-hydrocarbyl ether (ii), and/or the liquid hydrocarbon (iii), are together present in the composition of the present invention, in an amount of less than or equal to 99.8 percent by weight, such as from 80 percent by weight to 99.8 percent by weight, or from 85 percent by weight to 95 percent by weight, the percent weights in each case being based on the total weight of the composition.

The compositions of the present invention, with some embodiments, include: (a) at least one first silicon-containing compound that includes a compound represented by Formula (I-A), as described previously herein; (b) at least one second silicon-containing compound that includes a reaction product of a first reactant represented by Formula (II-A-1) and a second reactant represented by Formula (II-B-2), as described previously herein, such as in which w is from 1 to 20, t is from 0 to 50, u is from 0 to 50, (provided that the sum of t and u is at least 1 for each w, and provided that t is at least 1 for at least one w), and v is from 1 to 20; (i) an alcohol that includes isopropanol; (ii) a perfluorohydrocarbyl-hydrocarbyl ether that includes perfluoro-n-butyl methyl ether and/or perfluoro-n-butyl ethyl ether; and (iii) a liquid hydrocarbon that includes linear or branched $C_7$ alkane and/or linear or branched $C_8$ alkane.

The compositions of the present invention can optionally further include, with some embodiments, one or more additives. Examples of such additives include, but are not limited to: stabilizers, such as sterically hindered alcohols; protonic acids, such as carboxylic acids, hydrogen halides, sulphuric acids, and/or nitric acids; surfactants; antibacterial agents; anti-static compounds; and lubricants. If present, the optional additives can be present in the compositions of the present invention in amounts totaling up to 20 percent by weight, such as from 0.01 percent by weight to 20 percent by weight, based on the total weight of the composition. The protonic acid(s), with some embodiments, act as a catalyst, which catalyzes condensation of hydrolysable groups of the first and/or second silicon-containing compounds.

The present invention also relates to an article that includes a layer over at least a portion of a surface of the article, in which the layer includes the composition of the present invention, as described previously herein. The layer can include a single layer or multiple layers, in which each layer independently includes the same or a different composition according to the present invention. With some embodiments, each layer can independently be continuous or discontinuous (such as in the form of a pattern).

Articles according to the present invention can be fabricated from and include one or more materials, such as, but not limited to: organic polymers (including, for example, thermoplastic organic polymers and/or crosslinked organic polymers); inorganic polymers (including, for example, thermoplastic inorganic polymers and/or crosslinked inorganic polymers); metals (including, for example, iron, stainless steel, copper, aluminum, titanium, tantalum, chromium, zinc, and combinations two or more thereof, such as alloys of two or more thereof); metal oxides (including, for example, titanium oxides, tantalum oxides, chromium oxides, zinc oxides, iron oxides, aluminum oxides, tin oxides, indium oxides, and indium-tin-oxides); wood; glass (including, for example, silica based glass); ceramic materials; silicon based materials, and combinations of two or more such materials.

Examples of organic polymers from which articles according to the present invention can be at least partially fabricated include, but are not limited to: polyesters, polycarbonates, polyamides, polyimides, poly(meth)acrylates, polysulfones, polyolefins, polyvinyl alcohol, polysaccharides, polyepoxides, and combinations of two or more thereof. Examples of inorganic polymers from which articles according to the present invention can be at least partially fabricated include, but are not limited to polysiloxanes.

With some embodiments, the articles of the present invention are fabricated at least in part from organic polymers and/or inorganic polymers, that further include one or more reinforcing materials. Examples of reinforcing materials include, but are not limited to, glass fibers, glass beads, metal fibers, ceramic fibers, polyamide fibers, polyimide fibers, and combinations of two or more thereof.

Examples of articles according to the present invention include, but are not limited to: optical articles, such as ophthalmic lenses and non-ophthalmic lenses; windows, such as architectural windows, automotive windows, aircraft windows, nautical windows, and appliance windows (such as oven windows); silicon wafers; circuit boards; display devices, such as computer screens (such as for use with desk top computers, laptop computers, and tablet computer devices) and screens for electronic hand-held devices (such as mobile phones and smart phones); and fabrics (such as formed from organic and/or inorganic materials), including, but not limited to, woven and/or non-woven fabrics. With some embodiments, the article is a circuit board.

Each layer of the article can, with some embodiments, be formed over at least a portion of a surface of the article using one or more application methods as described further herein with regard to a method of treating an article according to the present invention. In accordance with some further embodiments, at least one layer of the article is separately formed and then adhered, such as laminated, to the article, optionally in the presence of an art-recognized adhesive layer interposed between the layer and the surface of the article.

The layer of the article of the present invention, with some embodiments, has a water contact angle of at least 900, such as from 90° to 1800, or from 90° to 1600, or from 90° to 1500. The water contact angle of the layer is determined in accordance with art-recognized methods and procedures. The water used to determine the water contact angle is, with some embodiments, deionized water. The water contact angle of the layer is determined with regard to the outer or upper surface of the layer.

Each layer of the article of the present invention can have any suitable thickness. With some embodiments, each layer of the article of the present invention has a thickness of at least 0.1 nanometers, such as from 0.1 nanometers to 1000 nanometers, or from 0.15 nanometers to 100 nanometers, or from 0.2 nanometers to 10 nanometers.

The present invention also relates to a method of treating an article that includes, applying the composition of the present invention over at least a portion of a surface of the article, thereby forming a layer that includes the composition of the present invention over at least the portion of the surface of said article. The article is, with some embodiments, as described previously herein. Each layer formed in accordance with some embodiments of the method of the present invention can be a single layer or multiple layers, in which each layer independently includes the same or a different composition according to the present invention. With some embodiments, each layer can independently be continuous or discontinuous (such as in the form of a pattern).

With some embodiments of the method of the present invention, each composition of the present invention is applied by an application method selected from spin application, spray application, dip application, curtain application, draw-down blade application, and combinations of two or more such application methods.

The method of the present invention further includes, with some embodiments, exposing the layer to elevated temperature. The layer is exposed to elevated temperature after the layer has been applied over the article, with some embodiments. As used herein, the term "elevated temperature" means a temperature that is greater than room temperature, such as greater than 25° C. The layer, with some embodiments, is exposed to an elevated temperature of 40° C. to 300° C. for 5 minutes to 8 hours. Exposing the layer to elevated temperatures is conducted, with some embodiments, for purposes including, but not limited to, driving volatile materials out of the layer and/or curing the layer.

The present invention also provides a silicon-containing compound that includes the reaction product of a first reactant represented by Formula (II-A) and a second reactant represented by Formula (II-B), as described previously herein. With some embodiments, the reaction product of the first reactant represented by Formula (II-A) and the second reactant represented by Formula (II-B), includes at least one compound represented by Formula (II-C), as described previously herein.

The present invention further provides a silicon-containing compound that includes the reaction product of a first reactant represented by Formula (II-A-1) and a second reactant represented by Formula (II-B-1), as described previously herein. With some embodiments, the reaction product of the first reactant represented by Formula (II-A-1) and the second reactant represented by Formula (II-B-1), includes at least one compound represented by Formula (II-D), as described previously herein.

The present invention is more particularly described in the following examples, which are intended to be illustrative only, since numerous modifications and variations therein will be apparent to those skilled in the art. Unless otherwise specified, all parts and percentages are by weight.

EXAMPLES

Synthesis Examples

The synthesis of first and second silicon-containing compounds of the compositions of the present invention are described as follows.

Synthesis Example-(A)

The synthesis of a first silicon-containing compound according to the present invention is described as follows.

A 2 liter triple-neck round bottom flask is fitted with a mechanical stirrer, an addition funnel, thermometer, a nitrogen sweep, and a heating mantle. The following is charged to the round bottom flask: 600 ml of a 1:1 mixture of HFE 7200 fluorosolvent (ethoxy-nanafluorobutane ($C_4F_9OCH_2CH_3$), commercially available from 3M Specialty Materials) and diethyl ether; 12.5 ml water (1.02 equivalents); and 63.3 ml aniline (formula weight of 93.13 g/mole, 1.02 equivalents). The following is added to the addition funnel: 140 ml of a 1:1 mixture of HFE 7200 fluorosolvent (ethoxy-nanafluorobutane, commercially available from 3M Specialty Materials) and diethyl ether; and 300 grams (g) of $CF_2(CF_2)_5(CH_2)_2$—$Si(CH_3)_2Cl$ (having a formula weight of 440.7 g/mole). With constant stirring and while maintaining the contents of the round bottom flask below 30° C., the contents of the addition funnel are added to the round bottom flask at a rate of 3-4 drops per second. After the contents of the addition funnel are added to the round bottom flask, 25 ml of a 1:1 mixture of HFE 7200 fluorosolvent (ethoxy-nanafluorobutane, commercially available from 3M Specialty Materials) and diethyl ether is added to the addition funnel and charged into the round bottom flask. The contents of the round bottom flask are maintained at room temperature with constant stirring for 16 hours. Progress of the reaction is determined by removing and purifying small aliquots of the contents of the round bottom flask followed by H-NMR analysis thereof.

When it is determined that the reaction is complete, solids are isolated from the contents of the round bottom flask by vacuum filtration through a medium glass frit. The collected filter cake is washed with HFE 7200 fluorosolvent (ethoxy-nanafluorobutane, commercially available from 3M Specialty Materials). The eluent is dried by the addition of 20 g anhydrous $Na_2SO_4$ with stirring for 20 minutes, followed by the addition of 10 g anhydrous $MgSO_4$ followed by stirring for an additional 20 minutes, followed by filtration to remove the drying agents. A small sample is analyzed to determine purity and silanol content. To this mixture is added about 82 ml of $Ta(OCH_2CH_3)_5$ so as to provide 2 equivalents of silanol (molecular weight of 421.27 g/mole) to 1 mole of Ta. This mixture is stirred at room temperature for 6 hours, followed by removal of solvent by rotary evaporation.

Synthesis Example-(B)

The synthesis of a second silicon-containing compound according to the present invention is described as follows.

A 2 liter triple-neck round bottom flask is fitted with a mechanical stirrer, reflux condenser, thermometer, a nitrogen sweep, and a heating mantle. Venting of the flask is provided by a 22 gauge needle located in the top of the reflux condenser.

The following is added to the round bottom flask: 1373 g of oligo(hexafluoropropylene oxide) allyl ether (having a molecular weight of 1500); 250 ml of HFE 7200 fluorosolvent (ethoxy-nanafluorobutane, commercially available from 3M Specialty Materials); 121.86 ml of a (50-55% methylhydrosiloxane)-(45-50% dimethylsiloxane) copolymer (having a molecular weight of 900-1200); and 250 ml tetrahydrofuan. While at room temperature, 75 mg $H_2PtCL_6$ in 1.5 ml of isopropyl alcohol is added to the contents of the round bottom flask. With constant stirring and under a nitrogen sweep, the contents of the round bottom flask are heated to and held at reflux (at a temperature of about 65° C.) for 6 hours. The progression of the reaction is determined by measuring the consumption of Si—H/allyl by FTIR/H-NMR. The reaction is stopped when it is determined that substantially all Si—H groups and allyl groups have been consumed. After completion of the reaction, the contents of the round bottom flask are filtered over CELITE silica to remove catalyst. The filtered liquid is then subjected to reduced pressure for purposes of removing solvent. The resulting isolated material has a solids of 100% by weight, and is generally described as a oligo(hexafluoropropylene oxide)-grafted poly(methylhydro)-co-poly(dimethyl) siloxane.

Formulation Example

A composition according to the present invention was prepared as summarized in the following table.

| Component | Percent by Weight |
|---|---|
| First silicon-containing compound (Synthesis Example A) | 0.3 |
| Second silicon-containing compound (Synthesis Example B) | 0.8 |
| Isooctane | 28.5 |
| HFE-7100 fluorosolvent[1] | 66.5 |
| Isopropanol | 3.9 |

[1]Methoxy-nanafluorobutae ($C_4F_9OCH_3$) fluorosolvent commercially available from 3M Specialty Materials)

Evaluation of the Formulation

A flat 6 inch×6 inch×⅛ inch (15.2 cm×15.2 cm×0.32 cm) polycarbonate substrate was dipped for 30 seconds in the formulation described above. After withdrawing the polycarbonate test specimen from the formulation, excess formulation was removed by wiping with a KIMWIPES tissue until the test specimen was observed to be optically clear. Prior to treatment with the formulation, the polycarbonate substrate was determined to have a water contact angle of 85-90°, and an n-hexadecane contact angle of 20°. After treatment with the formulation according to the present invention, the treated polycarbonate test specimen was found to have a water contact angle of 110°, and an n-hexadecane contact angle of 65°, indicating a substantial decrease in the surface energy of the treated polycarbonate substrate.

The present invention has been described with reference to specific details of particular embodiments thereof. It is not intended that such details be regarded as limitations upon the scope of the invention except insofar as and to the extent that they are included in the accompanying claims.

What is claimed is:
1. A composition comprising:
   (a) at least one first silicon-containing compound represented by the following Formula (I),

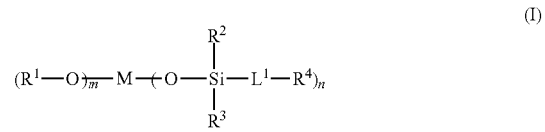

wherein M is a polyvalent transition metal,
$R^1$, $R^2$, and $R^3$ are each independently hydrocarbyl,
$L^1$ is a bond or a divalent hydrocarbyl group,
$R^4$ is a perfluorohydrocarbyl group, and
the sum of m and n is equal to the valency of said polyvalent transition metal M; and
   (b) at least one second silicon-containing compound comprising a reaction product of a first reactant represented by the following Formula (II-A) and a second reactant represented by the following Formula (II-B),

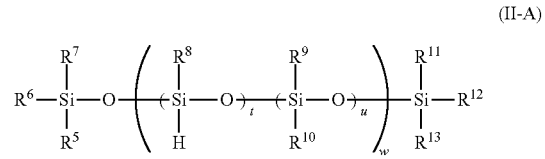

-continued

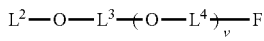
(II-B)

wherein for Formula (II-A) and Formula (II-B),
$R^5$ through $R^{13}$ are each independently hydrocarbyl,
$L^2$ is a hydrocarbyl group having at least one carbon-carbon unsaturated group that is capable of forming a silicon-carbon covalent bond,
$L^3$ is a divalent fluorinated hydrocarbyl group,
$L^4$ is a divalent perfluorohydrocarbyl group,
w is from 1 to 500,
t is from 0 to 1000,
u is from 0 to 1000,
provided that the sum of t and u is at least 1 for each w, and
provided that t is at least 1 for at least one w, and
v is from 1 to 100.

2. The composition of claim 1 wherein,
(a) independently for each first silicon-containing compound represented by Formula (I),
M is Ta or Nb,
the sum of m and n is 5,
$R^1$, $R^2$, and $R^3$ are each independently selected from the group consisting of linear or branched $C_1$-$C_{10}$ alkyl, $C_3$-$C_{10}$ cycloalkyl, and aryl,
$L^1$ is a bond or divalent linear or branched $C_1$-$C_{10}$ alkyl,
$R^4$ is linear or branched $C_1$-$C_{20}$ perfluoroalkyl, and
n is at least 1, and
(b) for said second silicon-containing compound,
$R^5$ through $R^{13}$ are each independently selected from the group consisting of linear or branched $C_1$-$C_{10}$ alkyl, $C_3$-$C_{10}$ cycloalkyl, and aryl,
$L^2$ is divalent linear or branched $C_2$-$C_{10}$ alkyl having one carbon-carbon unsaturated group that is capable of forming a silicon-carbon covalent bond, which is selected from alkene groups and alkyne groups,
$L^3$ is divalent linear or branched $C_1$-$C_{10}$ fluoroalkyl,
$L^4$ is divalent linear or branched $C_1$-$C_{10}$ perfluoroalkyl,
w is from 1 to 100,
t is from 0 to 500,
u is from 0 to 500, and
v is from 1 to 50.

3. The composition of claim 2 wherein,
(a) independently for each first silicon-containing compound represented by Formula (I),
M is Ta,
$R^1$, $R^2$, and $R^3$ are each independently selected from the group consisting of linear or branched $C_1$-$C_5$ alkyl,
$L^1$ is a bond or divalent linear or branched $C_1$-$C_5$ alkyl, and
$R^4$ is linear or branched $C_1$-$C_{10}$ perfluoroalkyl, and
(b) for said second silicon-containing compound,
$R^5$ through $R^{13}$ are each independently selected from the group consisting of linear or branched $C_1$-$C_5$ alkyl,
$L^2$ is divalent linear or branched $C_2$-$C_5$ alkyl having one carbon-carbon unsaturated group that is capable of forming a silicon-carbon covalent bond, which is selected from alkene groups,
$L^3$ is divalent linear or branched $C_1$-$C_5$ fluoroalkyl,
$L^4$ is divalent linear or branched $C_1$-$C_5$ perfluoroalkyl,
w is from 1 to 50,
t is from 0 to 100,
u is from 0 to 100, and
v is from 1 to 20.

4. The composition of claim 1, wherein an average ratio of t to u is from 0.5:1 to 2:1.

5. The composition of claim 1 wherein,
t is from 1 to 1000, and
u is 0.

6. The composition of claim 1 wherein,
(a) said first silicon-containing compound comprises a compound represented by the following Formula (I-A),

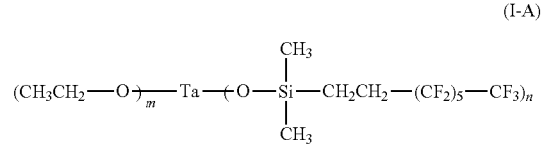
(I-A)

wherein the sum of m and n is 5, and
(b) for said second silicon-containing compound, said first reactant is represented by the following Formula (II-A-1) and said second reactant is represented by the following Formula (II-B-1),

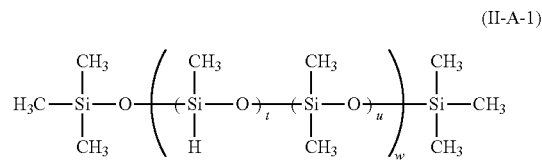
(II-A-1)

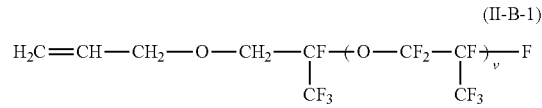
(II-B-1)

wherein for Formula (II-A-1) and Formula (II-B-1),
w is from 1 to 20,
t is from 0 to 50,
u is from 0 to 50,
provided that the sum of t and u is at least 1 for each w, and
provided that t is at least 1 for at least one w, and
v is from 1 to 20.

7. The composition of claim 6 wherein, for said first silicon-containing compound represented by Formula (I-A), n is at least 1.

8. The composition of claim 1 wherein, a weight ratio of said first silicon-containing compound (a) to said second silicon-containing compound (b) is from 1:3.5 to 3.5:1.

9. The composition of claim 8 wherein, said first silicon-containing compound (a) and said second silicon-containing compound (b) are together present in an amount of from 0.1 percent by weight to 5 percent by weight, based on total weight of said composition.

10. The composition of claim 1 further comprising at least one of,
(i) an alcohol represented by the following Formula (III),

(III)

wherein $R^{15}$ is a hydrocarbyl group, and x is from 1 to 10,
(ii) a perfluorohydrocarbyl-hydrocarbyl ether represented by the following Formula (IV),

(IV)

wherein $R^{16}$ is a perfluorohydrocarbyl group and $R^{17}$ is a hydrocarbyl group, and
(iii) a liquid hydrocarbon.

11. The composition of claim 10 wherein,
(i) for said alcohol represented by Formula (III),
    $R^{15}$ is linear or branched $C_1$-$C_{10}$ alkyl, $C_3$-$C_{10}$ cycloalkyl, or aryl, and
    x is from 1 to 3,
(ii) for said perfluorohydrocarbyl-hydrocarbyl ether represented by Formula (IV),
    $R^{16}$ is linear or branched $C_1$-$C_{10}$ perfluoroalkyl, and
    $R^{17}$ is linear or branched $C_1$-$C_{10}$ alkyl, $C_3$-$C_{10}$ cycloalkyl, or aryl, and
(iii) said liquid hydrocarbon comprises at least one linear or branched $C_5$-$C_{20}$ alkane.

12. The composition of claim 11 wherein,
(i) said alcohol comprises isopropanol,
(ii) said perfluorohydrocarbyl-hydrocarbyl ether comprises perfluoro-n-butyl methyl ether and/or perfluoro-n-butyl ethyl ether, and
(iii) said liquid hydrocarbon comprises linear or branched $C_7$ alkane and/or linear or branched $C_8$ alkane.

13. An article comprising a layer over at least a portion of a surface of said article, wherein said layer comprises said composition of claim 1.

14. The article of claim 13, wherein said article is a circuit board.

15. The article of claim 13, wherein said layer has a water contact angle of at least 90°.

16. A method of treating an article comprising,
applying said composition of claim 1 over at least a portion of a surface of said article, thereby forming a layer comprising said composition of claim 1 over at least said portion of said surface of said article.

17. The method of claim 16 wherein, said composition of claim 1 is applied by an application method selected from the group consisting of spin application, spray application, dip application, curtain application, draw-down blade application, and combinations of two or more thereof.

18. The method of claim 16 further comprising exposing said layer to elevated temperature.

19. A composition comprising:
(a) at least one first silicon-containing compound represented by the following Formula (I-A),

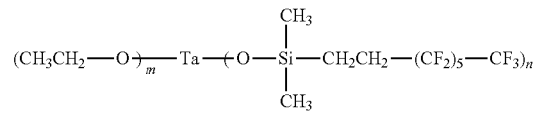

wherein the sum of m and n is 5, and
(b) at least one second silicon-containing compound comprising a reaction product of a first reactant represented by the following Formula (II-A-1) and a second reactant represented by the following Formula (II-B-2),

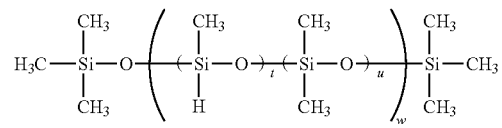

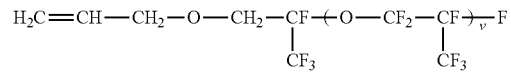

wherein for Formula (II-A-1) and Formula (II-B-1),
    w is from 1 to 20,
    t is from 0 to 50,
    u is from 0 to 50,
        provided that the sum of t and u is at least 1 for each w, and
        provided that t is at least 1 for at least one w, and
    v is from 1 to 20,
(i) an alcohol comprising isopropanol,
(ii) a perfluorohydrocarbyl-hydrocarbyl ether comprising perfluoro-n-butyl methyl ether and/or perfluoro-n-butyl ethyl ether, and
(iii) a liquid hydrocarbon comprising linear or branched $C_7$ alkane and/or linear or branched $C_8$ alkane.

* * * * *